(12) United States Patent
Takaishi

(10) Patent No.: US 7,538,377 B2
(45) Date of Patent: May 26, 2009

(54) SEMICONDUCTOR MEMORY DEVICE

(75) Inventor: Yoshihiro Takaishi, Tokyo (JP)

(73) Assignee: Elpida Memory, Inc. (JP)

( * ) Notice: Subject to any disclaimer, the term of this patent is extended or adjusted under 35 U.S.C. 154(b) by 158 days.

(21) Appl. No.: 11/353,257

(22) Filed: Feb. 14, 2006

(65) Prior Publication Data
US 2006/0180846 A1 Aug. 17, 2006

(30) Foreign Application Priority Data
Feb. 16, 2005 (JP) ............................. 2005-039217

(51) Int. Cl.
*H01L 29/76* (2006.01)

(52) U.S. Cl. ................ 257/314; 257/326; 257/261; 257/225; 257/368; 257/381; 438/706; 438/719

(58) Field of Classification Search ................ 257/288, 257/314, 368, 381, 225, 251, 326; 438/250–256, 438/396, 397, 700, 706, 719
See application file for complete search history.

(56) References Cited

U.S. PATENT DOCUMENTS

| | | | |
|---|---|---|---|
| 6,184,145 B1 * | 2/2001 | Takaishi | 438/706 |
| 6,407,464 B1 * | 6/2002 | Terauchi | 257/296 |
| 6,468,867 B1 * | 10/2002 | Lai et al. | 438/275 |
| 6,579,776 B2 * | 6/2003 | Terauchi | 438/396 |
| 2001/0054725 A1 * | 12/2001 | Nagai et al. | 257/288 |
| 2002/0024076 A1 * | 2/2002 | Nakabayashi | 257/296 |
| 2003/0214844 A1 * | 11/2003 | Iijima | 365/185.21 |
| 2005/0265100 A1 * | 12/2005 | Kitamura et al. | 365/210 |

FOREIGN PATENT DOCUMENTS

| | | |
|---|---|---|
| JP | 11340436 | 12/1999 |
| JP | 2000-91530 | 3/2000 |
| JP | 2001-118998 | 4/2001 |

* cited by examiner

*Primary Examiner*—M. Wilczewski
*Assistant Examiner*—Telly D Green
(74) *Attorney, Agent, or Firm*—Hayes Soloway P.C.

(57) ABSTRACT

In a cell contact pad method, a consecutive dummy cell contact pad intersecting with a cell gate electrode is formed at an outer peripheral portion of the memory cell array. The dummy cell contact pad blocks liquid and gas to intrude through a void, and prevents the cell contact pad from being decayed and having high resistivity.

7 Claims, 9 Drawing Sheets

SEMICONDUCTOR MEMORY DEVICE

This application claims priority to Japanese patent application JP 2005-39217, the disclosure of which is incorporated herein by reference.

BACKGROUND OF THE INVENTION

1. Field of the Invention

The present invention relates to a semiconductor memory device, and more particularly, to a semiconductor memory device including a cell contact pad.

2. Description of the Related Art

Following development of increase of storage capacity of a semiconductor memory device, a one gigabit DRAM (Hereinafter Dynamic Random Access Memory is referred to as DRAM for short) is in practical use. A dimension of an element used in the large capacity semiconductor memory device is miniaturized, and specifically, an interval between word lines (row lines) of the DRAM is reduced following miniaturization of a memory cell. As a result, formation of an interlayer film to be buried or embedded in the row lines is becoming difficult. Since capability of transistors has advanced, low temperature-heat treatment is required and the further lowering of the temperature is indispensable to form the interlayer films. In addition, forming an interlayer insulating film having excellent coatability at relatively low temperature becomes difficult and burying the space between the word lines becomes further difficult.

As a first conventional example, problems caused by the defective burying will be explained below referring to FIGS. 1A through 1D. As shown in FIG. 1A, a device separation region 52 is formed in a silicon substrate 51, and a gate electrode film having a gate insulating film 53, a gate lower electrode 54, a gate upper electrode 55, and a mask nitride film 56 is formed. Further, a patterning is performed so as to form a gate electrode. Furthermore, a side wall insulating film 57 for forming a cell contact hole is formed around the gate electrode. At this time, a gate electrode 7 of the memory cell and a gate electrode 13 of a peripheral circuit are simultaneously formed. Then, an interlayer insulating film 58 is formed. However, when an interval between the gates is narrow, a buried defect occurs so that a void 59 is formed. Next, as shown in FIG. 1B, a resist pattern of a contact hole is formed at a cell portion using a typical photolithography process. Further, a contact hole 60 in the cell is formed using the resist pattern as a mask, under a self-aligned etching condition having an etching selectivity against a nitride film.

Next, as shown in FIG. 1C, polysilicon is buried in the contact hole to thereby form a contact plug 61. In this event, when the void 59 is formed, the polysilicon also grows in the void 59. Further, although there is no problem in a direction perpendicular to the word line, as shown in FIG. 1C, polysilicon 62 intrudes in a void portion and thereby an electrical short circuit occurs between polysilicon plugs because the void 59 is formed between the contact plugs 61 in a parallel direction with the word line, as shown in FIG. 1D.

In order to solve these problems, the inventor of the present invention applied for patents as prior applications, i.e., Japanese Unexamined Patent Application Publication No. 11-340436 and Japanese Unexamined Patent Application Publication No. 2000-091530. In the Japanese Unexamined Patent Application Publication No. 11-340436 and the Japanese Unexamined Patent Application Publication No. 2000-091530, a cell contact pad process is described, in which a cell contact is formed not by means of contact hole, but by means of remainder pattern of an electric conductor as a structure of the cell contact. Hereinbelow, a cell contact pad method will be explained as a second conventional example (hereinafter, the cell contact pad is referred to as a cell-con pad).

In the cell-con pad method shown in FIGS. 2, 3A, and 3B, the device separation region 52 is formed in the silicon substrate 51 and the gate electrode film including the gate insulating film 53, the gate lower electrode 54, the gate upper electrode 55, and the mask nitride film 56 is formed. The patterning of the cell gate electrode 7 of the memory cell is performed and the side wall insulating film 57 for forming the cell contact hole is formed around the gate electrode. Thereafter, the polysilicon is deposited and the patterning of the polysilicon is carried out so that a cell-con pad 10 is formed. Thereafter, an interlayer insulating film 11 is formed and the patterning of the interlayer insulating film 11 and the mask nitride film 56 is performed. Further, the patterning of the gate electrode 13 at a peripheral portion is performed. Since the interlayer insulating film 11 is formed after the cell-con pad 10 is formed, even when a void 22 is formed in the interlayer insulating film 11 between the gate electrodes 7, the electrical short circuit does not occur between the cell-con pads 10.

However, even in these cell-con pad methods, below mentioned problems are found on the basis of knowledge of the inventor of the present invention. FIG. 3B is a cross-section along a cutting line Y-Y' of FIG. 2, and when the interlayer insulating film 11 between the cell gate electrodes 7 is defectively buried, a void 31 is generated at a periphery along the cell gate electrode 7. Further, a cell-con pad 30 of an outermost periphery is exposed to wet liquid, gas, or the like, while the peripheral gate electrode 13 is formed and the interlayer insulating film on the peripheral gate is formed. Further, as shown in FIG. 2, the gas or the like may has to intrude or invade into the cell-con pad 10 to be located deeper back, through an approaching path 32 including space between the cell gate electrodes and between the cell-con pads. The intruded gas, moisture, or the like decays the electrodes and causes the portion, at which a diffusion layer and the cell-con pad 10 come in contact with each other, to have high resistivity.

Further, with regard to the miniaturization of the memory cell, another patent application, namely Japanese Unexamined Patent Application Publication No. 2001-118998 is found, for example. In the Japanese Unexamined Patent Application Publication No. 2001-118998, a technology is described in which a dummy contact pad is provided at an outer periphery of the memory cell so that an electrical short circuit between a bit line and a word line is thereby prevented. However, any one of the patent applications does not include recognition of the aforementioned problems that is found by the inventor of the present invention, and any of the means for solving the problems is not described as well.

As described above, in the conventional cell-con pad method that forms a memory cell, the cell-con pad 30 of an outermost periphery of the memory cell is exposed to the wet liquid, gas, or the like in a process, such as the patterning of the gate electrode of the peripheral circuit or the like. As a result, the gas or the like intrudes into the cell-con pad 10 to be located deeper back through an approaching path 32 including space between the cell gate electrodes and between the cell-con pads. The intruded gas, moisture, or the like decays the electrodes and causes a portion, at which a diffusion layer and the contact come in contact with each other, to have high resistivity. However, any one of the patent applications does not include recognition of the aforementioned problems and any one of the means for solving the problems is not described as well.

SUMMARY OF THE INVENTION

It is therefore an object of the present invention to provide a miniaturized semiconductor memory device having a high reliability by forming a dummy cell-con pad intersecting with a word line (a row line), and forming a cell-con pad having a high reliability even when the space between the word lines is not completely buried by the interlayer insulating film in a cell contact pad process.

In a first aspect of the present invention, there is provided a semiconductor memory device comprising:
a memory cell array; and
an etching prevention device formed of a consecutive pattern intersecting with a cell gate electrode at an outer peripheral portion of the memory cell array.

Preferably, the etching prevention device is a dummy cell contact pad formed of a consecutive pattern at an outside of a cell contact pad of an outermost periphery of the memory cell array.

Preferably, the etching prevention device is formed in a separation region of the outer peripheral portion of the memory cell array.

Preferably, the dummy cell contact pad orthogonally intersects with the cell gate electrode.

Preferably, the dummy cell contact pad has approximately identical interval along the cell contact pad of an outermost peripheral memory cell of the memory cell array.

In a second aspect of the present invention, there is provided a semiconductor memory device comprising:
a memory cell array,
wherein an etching prevention device formed of a consecutive pattern intersecting with a cell gate electrode at an outer peripheral portion of the memory cell array is laid out.

Preferably, the etching prevention device comprises a dummy cell contact pad formed of a consecutive pattern, and the etching prevention device is laid out at an outside of the cell contact pad of an outermost periphery of the memory cell array.

Preferably, the etching prevention device is laid out in a separation region of the outer peripheral portion of the memory cell array.

Preferably, the dummy cell contact pad is laid out orthogonally intersecting with the cell gate electrode.

Preferably, the dummy cell contact pad is laid out so as to have approximately identical interval along the cell contact pad of the outermost peripheral memory cell of the memory cell array.

In the first and second aspects of the present invention, the semiconductor memory device preferably comprises the dummy cell contact pad; a bit line from a diffusion layer to the memory cell array; and the cell contact pad serving as a taking-out electrode for the capacitor lower electrode.

According to the first aspect of the present invention, decay of the cell contact pad of a memory cell and occurrence of the high resistivity thereof can be prevented.

Further, according to the second aspect of the present invention, the semiconductor memory device to be optimum for miniaturization, having a high reliability can be obtained.

DESCRIPTION OF THE PREFERRED EMBODIMENTS

Figure 1A:
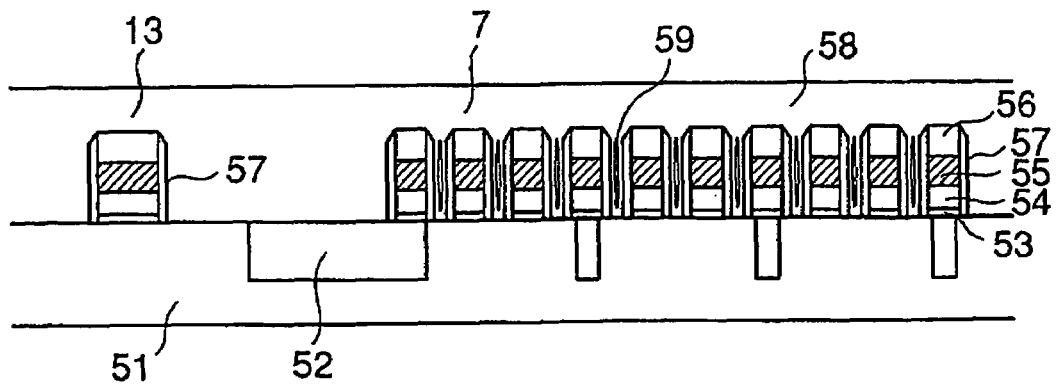
FIGS. 1A through 1D are cross-sections of a first conventional example.
Figure 1B:
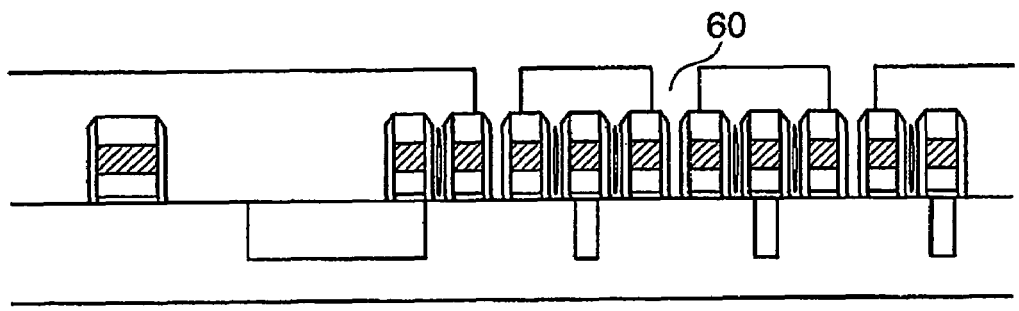
Figure 1C:
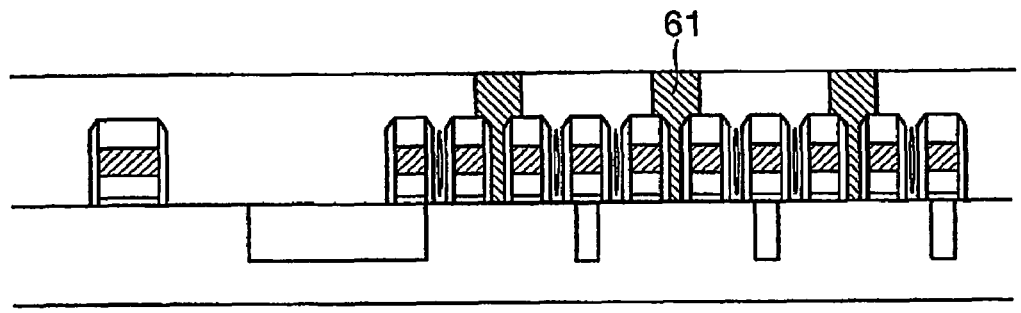
Figure 1D:
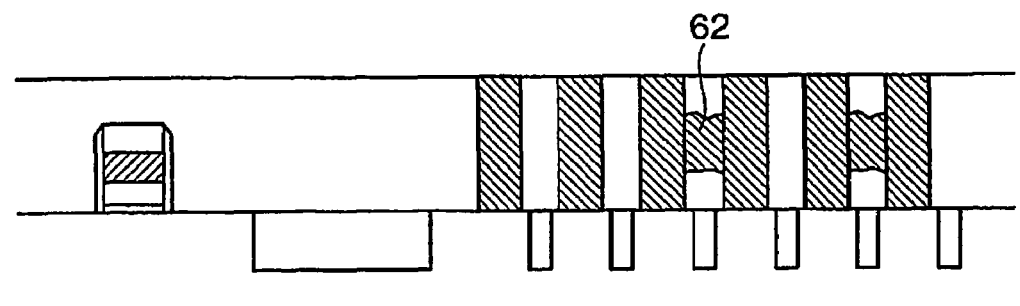
Figure 2:
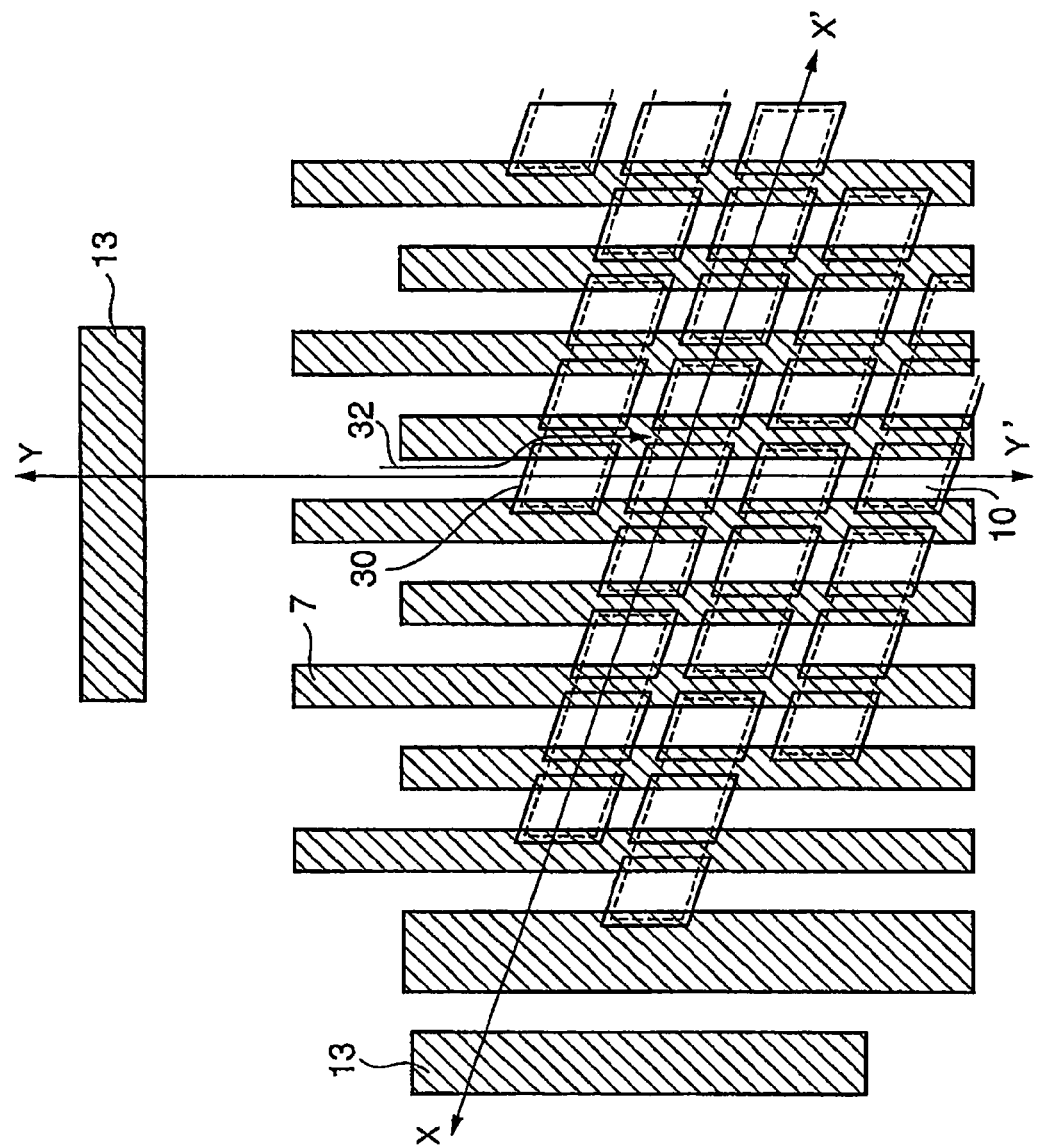
FIG. 2 is a plan view of a second conventional example.
Figure 3A:
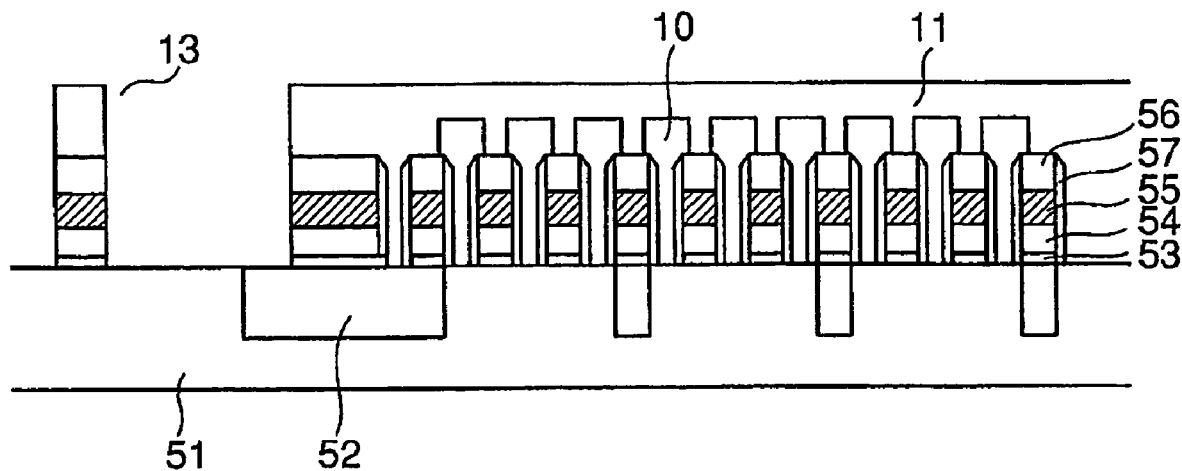
FIGS. 3A and 3B are cross-sections of a second conventional example.
Figure 3B:
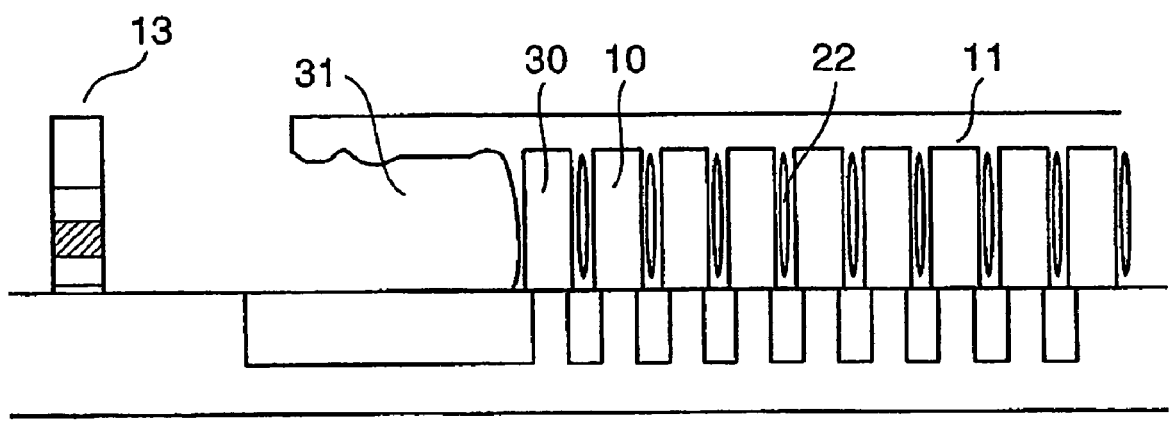

The present invention will be explained below in detail referring to the drawings.

First Embodiment

Figure 4:
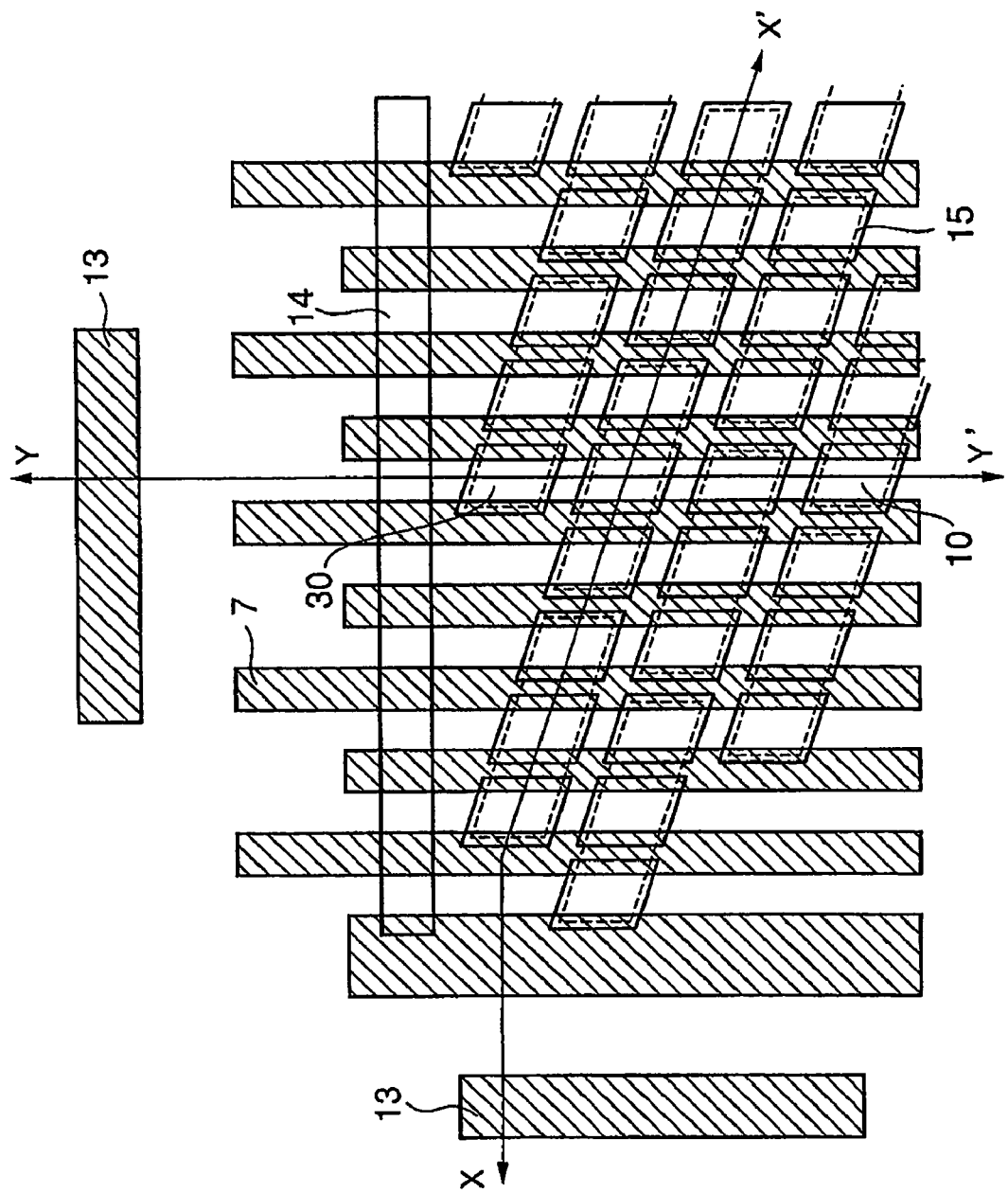
FIG. 4 is a plan view of a first embodiment according to the present invention.
Figure 5A:
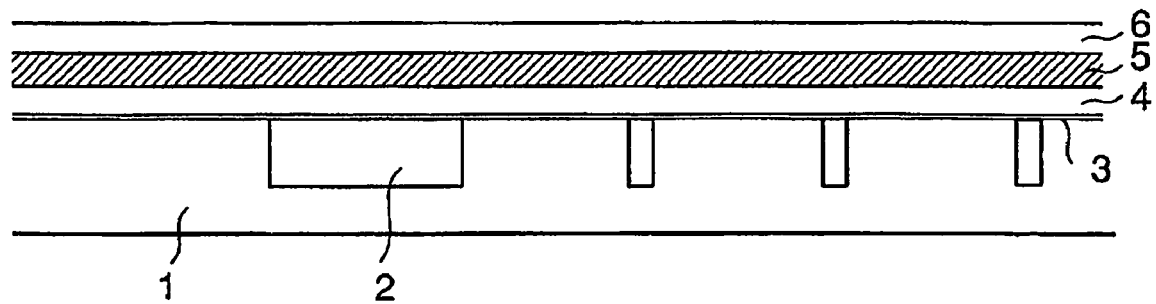
FIGS. 5A through 5I are cross-sections of a first embodiment according to the present invention.
Figure 5B:
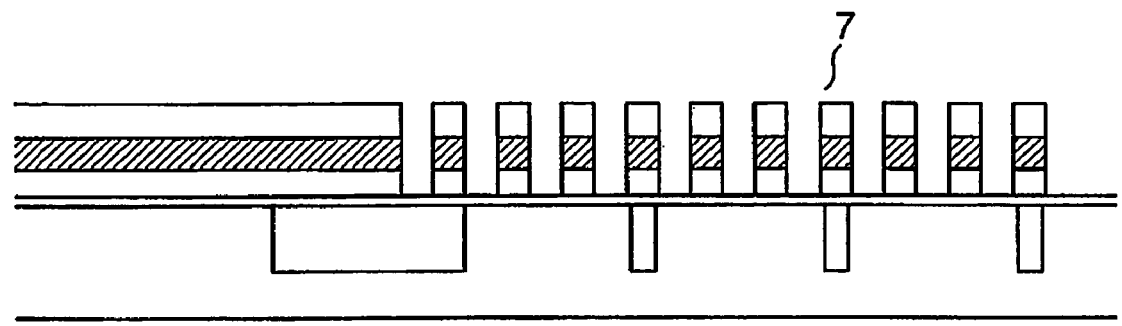
Figure 5C:
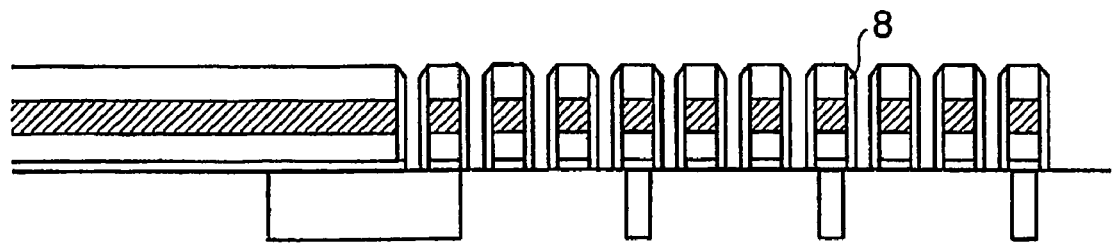
Figure 5D:
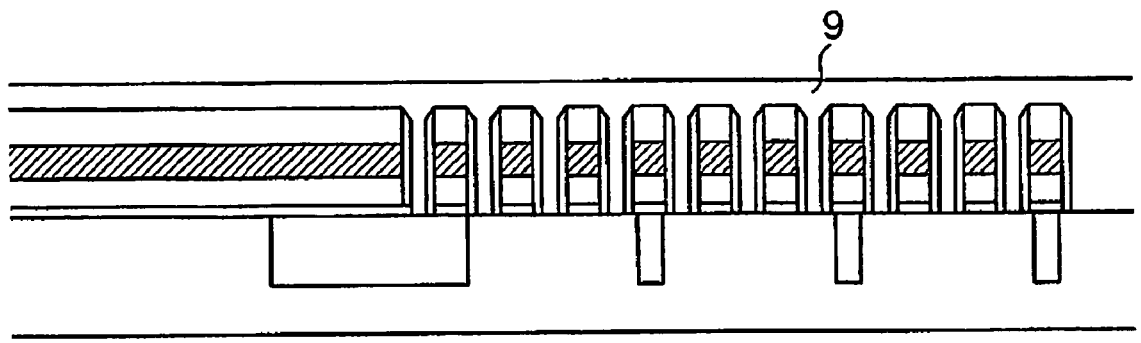
Figure 5E:
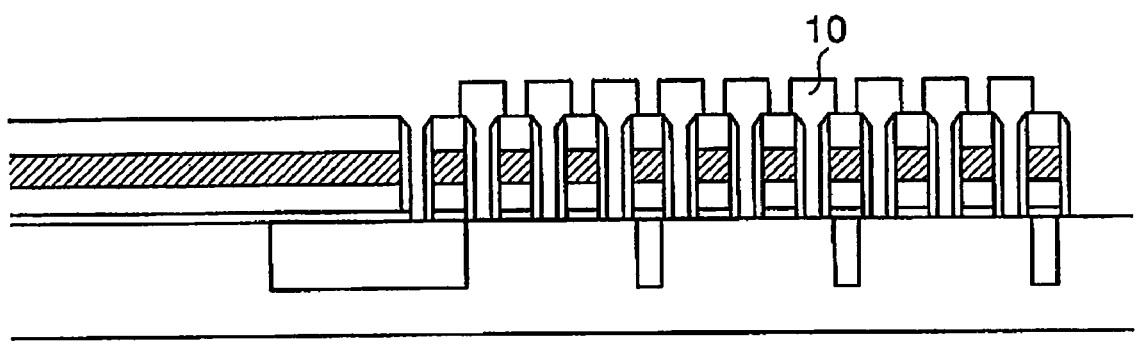
Figure 5F:
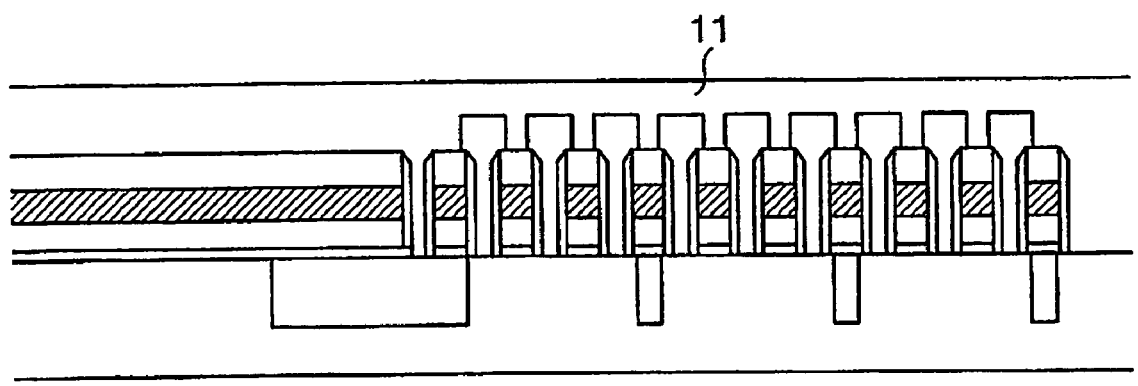
Figure 5G:
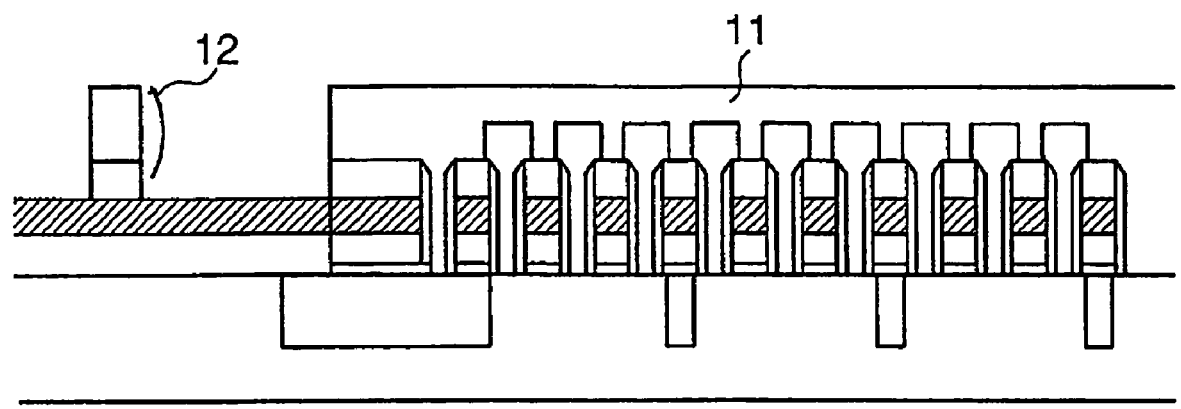
Figure 5H:
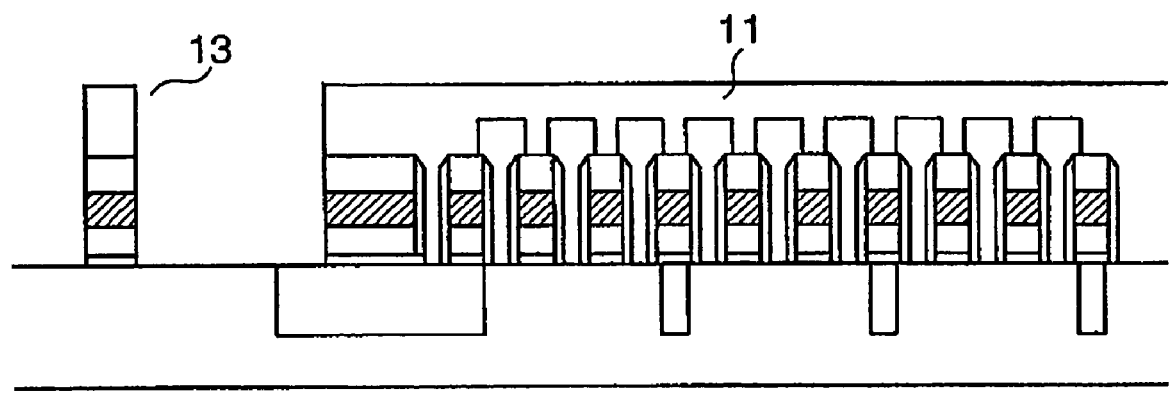
Figure 5I:
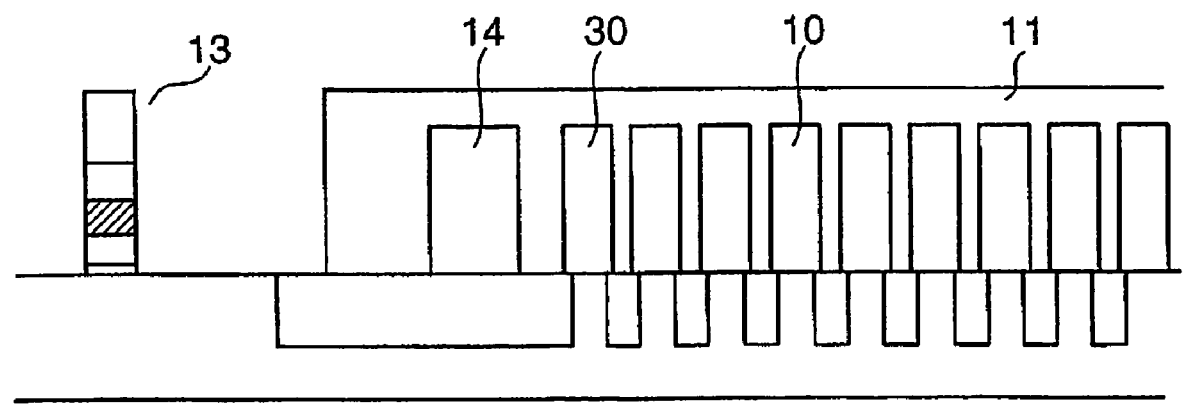

A first embodiment is explained referring to FIGS. 4 through FIG. 5I. FIG. 4 is a plan view, and FIGS. 5A through 5H are cross-sections along a cutting line X-X' of FIG. 4, and FIG. 5I is a cross-section along a cutting line Y-Y' of FIG. 4.

FIG. 4 is a plan view illustrating an end portion of a memory cell array and only a pattern relevant to the present invention is shown. A cell gate electrode 7 serving as a word line (a row line) is wired in a vertical direction (an above and below direction) in the figure and the cell-con pad 10 is disposed between the cell gate electrodes 7 slanting in a horizontal direction (in a direction parallel to the surface of the paper sheet). A set of three cell-con pads 10 is formed in a consecutive active region 15. The one cell-con pad in the three, which is located at a center, serves as a bit line, and the remaining two cell-con pads to be capacitor lower electrodes are respectively disposed at each of the left and the right sides of the bit line via a cell gate electrode 7. Accordingly, two memory cells connected to one bit line are formed in the consecutive active region 15 where the sets of three cell-con pads 10 are consecutively formed.

At the end portion of the cell gate electrode 7, a dummy cell-con pad 14 is disposed. The dummy cell-con pad 14 has a form different from that of the cell-con pad 10 used in the memory cell, and is formed as consecutive linear pattern at an end of the memory cell array intersecting with the cell gate electrode 7 in a direction approximately perpendicular to the cell gate electrode 7. The dummy cell-con pad 14 is formed on a device separation region 2. In addition, a dummy cell gate electrode and the peripheral gate electrode 13 used in a peripheral circuit are disposed at an outside thereof.

As shown in FIG. 5A, at first, the device separation region 2 is formed in a silicon substrate 1. After forming a gate oxidation film 3, each of 70 nm of polysilicon serving as a gate lower electrode 4, and 100 nm of W/WN serving as a gate upper electrode 5 are deposited on the silicon substrate.

Next, a mask nitride film 6 that serves as an etching mask when the gate etching is performed, and that serves as an insulator for insulating the cell-con pad 10, formed later, and the cell gate electrode 7 is deposited on the gate upper electrode 5 to the thickness of about 200 nm over the entire surface of the gate upper electrode 5.

Subsequently, as shown in FIG. 5B, a resist pattern of a cell gate portion is formed by the use of the typical photolithography. In this event, the resist pattern is approximately only for a cell portion and the mask nitride film 6 is etched by using the resist pattern as a mask.

Successively, the gate upper electrode 5 and the gate lower electrode 4 are etched by using the mask nitride film 6 as a mask. In this manner, the cell gate electrode 7 of the cell portion is formed.

Then, as shown in FIG. 5C, at a side wall of the cell gate electrode 7, a side wall insulating film 8 for electrically insulating the cell-con pad, formed later, is formed.

Subsequently, as shown in FIG. 5D, a polysilicon 9 which becomes a cell-con pad is formed on the entire surface. Next, as shown in FIG. 5E, a resist pattern of the cell-con pad is formed by the use of the typical photolithography. The polysilicon is etched by using the resist pattern as a mask so that the cell-con pad 10 is formed.

Then, as shown in FIG. 5F, an interlayer insulating film 11 is formed. The interlayer insulating film 11 serves as an interlayer insulating film on the cell-con pad 10, and also serves as an etching mask used when a peripheral gate electrode is processed.

Subsequently, as shown in FIG. 5G, the resist pattern serving as the peripheral gate electrode is formed by the use of the typical photolithography. This resist pattern is formed for a part approximately other than the cell portion and the cell portion is covered with the resist pattern over the entire surface. The interlayer insulating film 11 and the mask nitride film 6 are etched by using the resist pattern as a mask, and a mask insulating film 12 that forms the gate electrode is formed. Next, as shown in FIG. 5H, peripheral gate electrode 13 is formed by etching the gate upper electrode 5 and the gate lower electrode 4 by using the mask insulating film 12 as a mask. FIG. 5I is the cross-section along the cutting line Y-Y' of FIG. 4 in a parallel direction with the gate at this moment. The dummy cell-con pad 14 disposed at the end portion of the word line shown in FIG. 4 is disposed at a position shown in FIG. 5I.

The dummy cell-con pad 14 is formed by consecutive pattern intersecting with the cell gate electrode 7. As shown in FIG. 5I, in a direction parallel to the cell word line, the buried defect may be caused to occur in the interlayer insulating film 11 between the cell-con pads 10 in the cell. However, since the consecutive dummy cell-con pad 14 exists at the outermost periphery, an intrusion or invasion of the moisture, the gas, or the like from outward can be avoided. Further, even when the moisture, the gas, or the like intrudes or invades from outward, the moisture, the gas, or the like is avoided to intrude over the dummy cell-con pad 14. This is because the dummy cell-con pad serves as a breakwater. Consequently, even when the buried defect occurs in the interlayer insulating film 11, reliability of the cell contact can be secured. Therefore, in case where the mask insulating film and the peripheral gate electrode are patterned, the dummy cell-con pad 14 serves as a device for preventing etching liquid or the gas from intruding.

Thus, in the present embodiment, the consecutive dummy cell-con pad 14 is formed at the outermost periphery of the cell gate electrode in a direction perpendicular to the cell gate electrode. With this structure, even when the buried defect occurs in the interlayer insulating film, the moisture, the gas, or the like from outward can be thereby prevented from intruding. As a result, the decay of the electrode due to the intrusion of the moisture, the gas, and the like from outward can be prevented. Further, the contact portion of the diffusion layer and the contact can be prevented from having high resistivity. Accordingly, a miniaturized semiconductor memory device having high reliability can be obtained.

Second Embodiment

Figure 6:
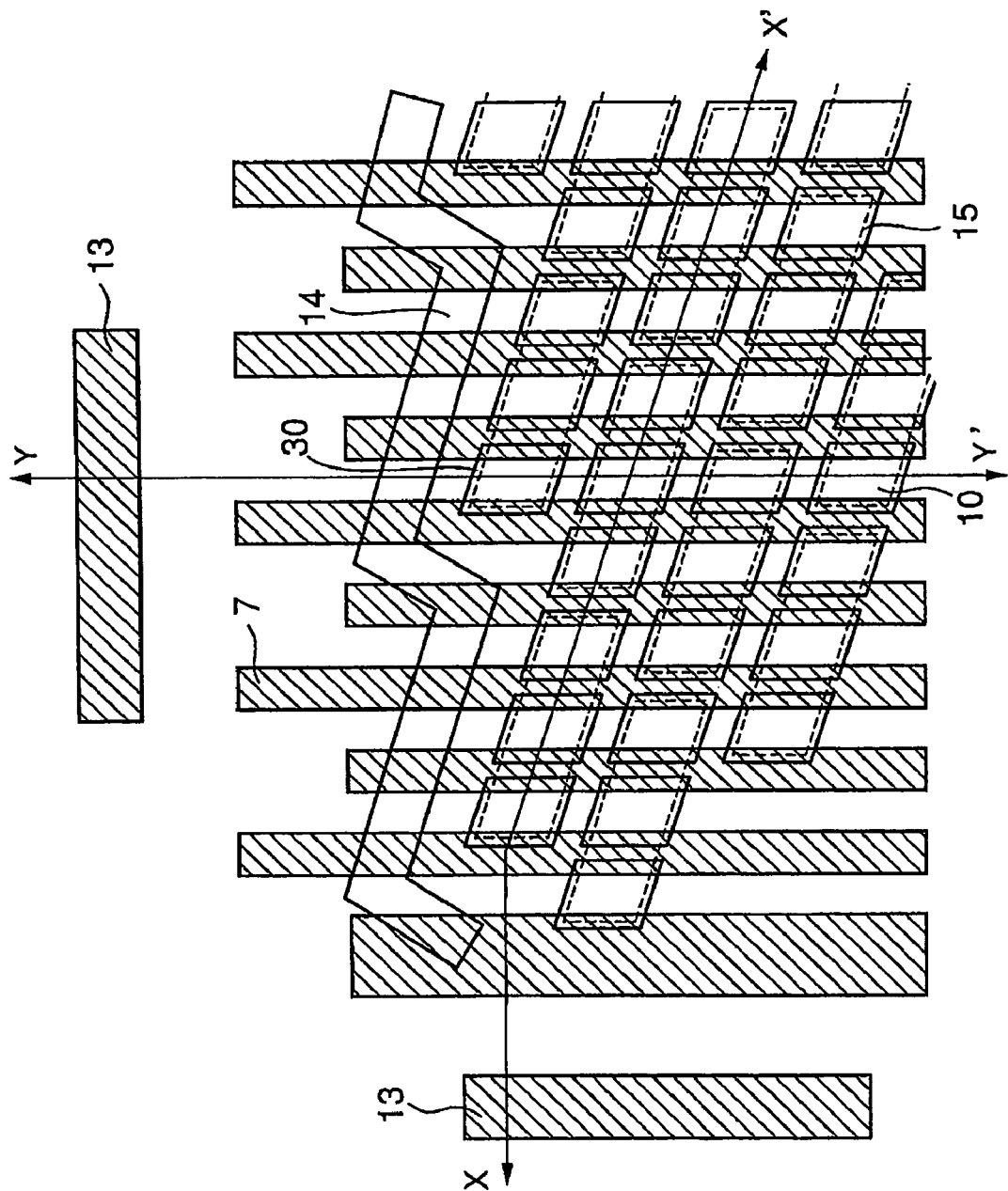
FIG. 6 is a plan view of a second embodiment according to the present invention.
Figure 7:
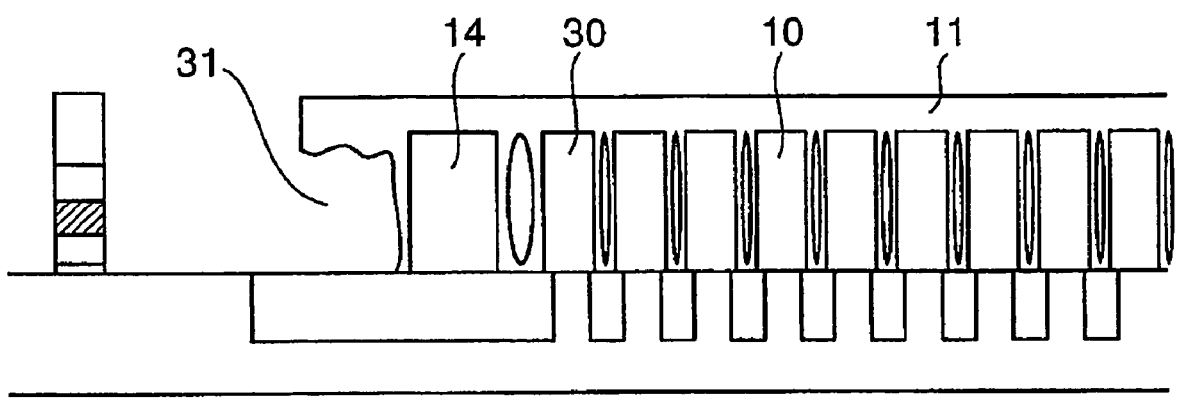
FIG. 7 is a cross-section of a second embodiment according to the present invention.

A second embodiment is explained referring to FIGS. 6 and 7. FIG. 6 is a plan view, and FIG. 7 is a cross-section along a cutting line Y-Y' of FIG. 6. In this embodiment, the only difference between the first embodiment and the second embodiment is that of a shape of the dummy cell-con pad, and other component of the second embodiment is identical of that in the first embodiment. The shape of the dummy cell-con pad 14 in the second embodiment is configured to be a jagged consecutive pattern intersecting with the cell gate electrode in a manner so as to keep approximately constant interval along a memory cell pattern of the outermost periphery.

As is clear from the plan view of FIG. 6, the dummy cell-con pad 14 is always disposed at a side outer than the cell pattern of the outermost periphery. As a result, even when the buried defect of the interlayer insulating film 11 occurs, a reliability of the device can be secured. In the cross-section of FIG. 7, a void is formed between the cell-con pad 30 of the outermost periphery and the dummy cell-con pad 14, and is also formed at an outside of the dummy cell-con pad 14. However, the intrusion of the moisture, the gas, or the like from outward can be avoided by decoupling the void 31 formed around the dummy cell-con pad 14. The intrusion of the moisture, the gas, or the like from outward to the cell-con pad 30 of the outermost periphery, and to the cell-con pad 10 at an inner part no longer occurs. Since the intrusion of the moisture, the gas, or the like from outward can be avoided, the reliability of the cell-con pad can be secured.

In the second embodiment, since the dummy cell-con pad 14 having the jagged consecutive pattern intersecting with the cell gate electrode in a manner so as to keep approximately constant interval along the memory cell pattern of the outermost periphery is formed. With this structure, even when the buried defect occurs in the interlayer insulating film, the intrusion of the moisture, the gas, or the like from outward can be prevented. Consequently, the decay of the electrode due to the intrusion of the moisture, the gas, and the like from outward can be prevented. Further, the contact portion of the diffusion layer and the contact can be prevented from having high resistivity. Accordingly, a miniaturized semiconductor memory device having high reliability can be obtained.

While the invention has been described with reference to a specific embodiment, the description is illustrative of the invention and is not to be construed as limiting the invention. It will be apparent that various modifications and variations can be made in the construction without departing from the scope of the invention.

What is claimed is:

1. A semiconductor memory device comprising:
 a semiconductor substrate having a memory cell array portion;
 a plurality of word lines running over the memory cell array portion in a first direction substantially parallel to one another, each of the word lines being extended over an outside portion of the memory cell array portion;
 a plurality of memory cell transistors formed in the memory cell array portion, each of the memory cell transistors having a gate electrode constituted by a part of an associated one of the word lines and a pair of cell contact pads each formed between adjacent ones of the word lines; and
 a dummy cell contact pad formed over the outside portion of the memory cell array portion and continuously running in a second direction to cross over each of the word lines, the dummy cell contact pad thereby having portions respectively filling gaps between adjacent ones of the word lines.

2. The device as claimed in claim 1, further comprising an isolation region formed in the outside portion of the memory cell array portion, each of the portions of the dummy cell contact pad being in contact with the isolation region.

3. The device as claimed in claim 2, wherein one of the pair of the cell contact pads of one of the memory cell transistors is in common to one of the pair of the cell contact pads of an adjacent memory cell transistor to the one of the memory cell transistors.

4. The device as claimed in claim 1, wherein the dummy cell contact pad is formed in a substantially straight line shape.

5. The device as claimed in claim 1, wherein the dummy cell contact pad is formed in a zigzag shape.

6. The device as claimed in claim 1, wherein the dummy cell contact pad is substantially a same height as each of the cell contact pads of each of the memory cell transistors.

7. The device as claimed in claim 1, wherein the dummy cell contact pad is formed simultaneously with each of the cell contact pads of each of the memory cell transistors.

* * * * *